US010164569B2

(12) United States Patent
Chen

(10) Patent No.: US 10,164,569 B2
(45) Date of Patent: Dec. 25, 2018

(54) SIGNAL GENERATOR AND ASSOCIATED RESONATOR CIRCUIT

(71) Applicant: MEDIATEK Inc., Hsin-Chu (TW)

(72) Inventor: Yen-Tso Chen, Kaohsiung (TW)

(73) Assignee: MediaTek Inc., Hsin-Chu (TW)

( * ) Notice: Subject to any disclaimer, the term of this patent is extended or adjusted under 35 U.S.C. 154(b) by 124 days.

(21) Appl. No.: 15/292,208

(22) Filed: Oct. 13, 2016

(65) Prior Publication Data

US 2017/0141728 A1 May 18, 2017

Related U.S. Application Data

(60) Provisional application No. 62/256,225, filed on Nov. 17, 2015.

(51) Int. Cl.
*H03B 5/12* (2006.01)
*H03B 5/18* (2006.01)

(52) U.S. Cl.
CPC ......... *H03B 5/1212* (2013.01); *H03B 5/1215* (2013.01); *H03B 5/1228* (2013.01); *H03B 5/1268* (2013.01); *H03B 5/1852* (2013.01); *H03B 2200/0016* (2013.01); *H03B 2201/025* (2013.01)

(58) Field of Classification Search
CPC .................................................. H03B 5/1212
USPC .................................................. 331/117 FE
See application file for complete search history.

(56) References Cited

U.S. PATENT DOCUMENTS

| 7,154,349 | B2 | 12/2006 | Cabanillas | |
|---|---|---|---|---|
| 7,955,886 | B2 | 6/2011 | Marques | |
| 8,884,713 | B2 * | 11/2014 | Tham | H03B 1/04 331/117 FE |
| 2006/0226943 | A1 | 10/2006 | Marques | |
| 2009/0289727 | A1 | 11/2009 | El Rai | |
| 2013/0296217 | A1 * | 11/2013 | Afshari | H03B 5/1228 510/300 |

(Continued)

FOREIGN PATENT DOCUMENTS

WO 2012054826 A1 4/2012

OTHER PUBLICATIONS

Taghivand, et al.: "A 3.24-to-8.45GHz Low-Phase-Noise Mode-Switching Oscillator"; ISSCC 2014/Sesstion 21/ Frequency Generation Techniques/21.5; pp. 368-370.

(Continued)

*Primary Examiner* — Joseph Chang
(74) *Attorney, Agent, or Firm* — Wolf, Greenfield & Sacks, P.C.

(57) ABSTRACT

A signal generator and an associated resonator circuit are provided. The signal generator includes the resonator circuit and a core circuit. The resonator circuit further includes a first inductor (L1), a second inductor (L2), a plurality of capacitors and a switching circuit. The first inductor (L1) has a first terminal (N1) and a third terminal (N3), and the second inductor (L2) has a second terminal (N2) and a fourth terminal (N4). The switching circuit includes a first switch (S1), a second switch (S2), a third switch (S3) and a fourth switch (S4). The core circuit further includes a first inner circuit, a first outer circuit, a second inner circuit, and a second outer circuit. Configurations of these switches are adjustable and resonance caused between these terminals is changed accordingly.

19 Claims, 13 Drawing Sheets

(56) References Cited

U.S. PATENT DOCUMENTS

2015/0364242 A1* 12/2015 Aboush .................. H03L 7/099
336/192

OTHER PUBLICATIONS

Agrawal, et al.: "A 6.39GHz-14GHz Series Resonator Mode-Switching Oscillator with 186-188dB FoM and 197dB FoMA in 65nm CMOS"; 978-1-4799-7642-3/15/$31.00 © 2015 IEEE; 2015 IEEE Radio Frequency Integrated Circuits Symposium; pp. 199-202.
Li, et al.: "A Distributed Dual-Band LC Oscillator Based on Mode Switching"; IEEE Transactions on Microwave Theory and Techniques, vol. 59, No. 1, Jan. 2011; pp. 99-107.
Cassia, et al.: "A Low-Power CMOS SAW-Less Quad Band WCDMA/HSPA/HSPA+/1X/EGPRS Transmitter"; IEEE Journal of Solid-State Circuits, vol. 44, No. 7, Jul. 2009; pp. 1897-1906.
Liscidini, et al.: "A Power-Scalable DCO for Multi-Standard GSM/WCDMA Frequency Synthesizers"; IEEE Journal of Solid-State Circuits, vol. 49, No. 3, Mar. 2014; pp. 646-656.
Hadjichristos, et al.: "Single-Chip RF CMOS UMTS/EGSM Transceiver with Integrated Receive Diversity and GPS"; ISSCC 2009 / Session 6 / Cellular and Tuner / 6.4; pp. 118-120.
EP Search Report dated Mar. 15, 2017 in European application (No. 16196879.7-1805).

* cited by examiner

SIGNAL GENERATOR AND ASSOCIATED RESONATOR CIRCUIT

This application claims the benefit of U.S. provisional application Ser. No. 62/256,225, filed Nov. 17, 2015, the disclosure of which is incorporated by reference herein its entirety.

TECHNICAL FIELD

The disclosure relates in general to a signal generator and an associated resonator circuit, and more particularly to a signal generator and an associated resonator circuit having configurable switching circuit so that resonance frequency of oscillation signal can be adjusted.

BACKGROUND

A radio frequency (hereinafter, RF) apparatus, such as an RF transceiver, may include various blocks of analog and digital circuitry. In digital RF transceivers, phase-locked loop (hereinafter, PLL) is used to demodulate and/or modulate the incoming and/or outgoing signals. Oscillators are used in electronic circuits and systems to provide a central clock signal, which is utilized to control the sequential operation of the entire system. A digitally controlled oscillator (hereinafter, DCO) is one of the most critical blocks in a digital PLL.

Different communication systems have different requirements of oscillation frequency. Thus, DCO design for cellular applications to achieve universal coverage for a wide range of frequencies in different communication standards is a trend. Conventionally, multiple DCOs are implemented to cover distinct bands required by different communication standards. However, hardware cost and power consumption of the DCO may increase.

SUMMARY

The disclosure is directed to a signal generator and an associated resonator circuit. The signal generator and associated resonator have configurable switches and resonance caused in the signal generator can be adjusted.

According to one embodiment, a signal generator is provided. The signal generator includes a resonator circuit, a first inner circuit (Gm1), and a first outer circuit (Gm3 or Gm4). The resonator circuit includes a first inductor (L1), a second inductor (L2), and a switching circuit. The first inductor (L1) has a first terminal (N1) and a third terminal (N3), and the second inductor (L2) has a second terminal (N2) and a fourth terminal (N4). The switching circuit includes a plurality of switches. Configurations of the plurality of switches are adjustable and resonance generated between the first, the second, the third and the fourth terminals (N1, N2, N3 and N4) is changed accordingly. The first inner circuit (Gm1) is electrically connected to the first terminal (N1) and the third terminal (N3), for compensating a first inner oscillation signal generated between the first and the third terminals. The first outer circuit is electrically connected to the first inductor (L1) and the second inductor (L2), for compensating a first outer oscillation signal generated between one of the first and the third terminals (N1 and N3) and one of the second and the fourth terminals (N2 and N4).

According to another embodiment, a resonator circuit is provided. The resonator circuit includes a first inductor (L1), a second inductor (L2), a plurality of capacitors, and a switching circuit. The first inductor (L1) has a first terminal (N1) and a third terminal (N3), and the second inductor (L2) has a second terminal (N2) and a fourth terminal (N4). The first inductor (L1) is electrically connected to a first inner circuit. One of the first and the third terminals (N1 and N3) and one of the second and the fourth terminals (N2 and N4) are electrically connected to a first outer circuit. Each of the plurality of capacitors is electrically connected to one of the first, the second, the third, and the fourth terminals (N1, N2, N3 and N4). The switching circuit includes a plurality of switches, wherein configuration of the plurality of switches are adjustable and resonance generated between the first, the second, the third and the fourth terminals (N1, N2, N3 and N4) is changed accordingly.

Figure 1A:
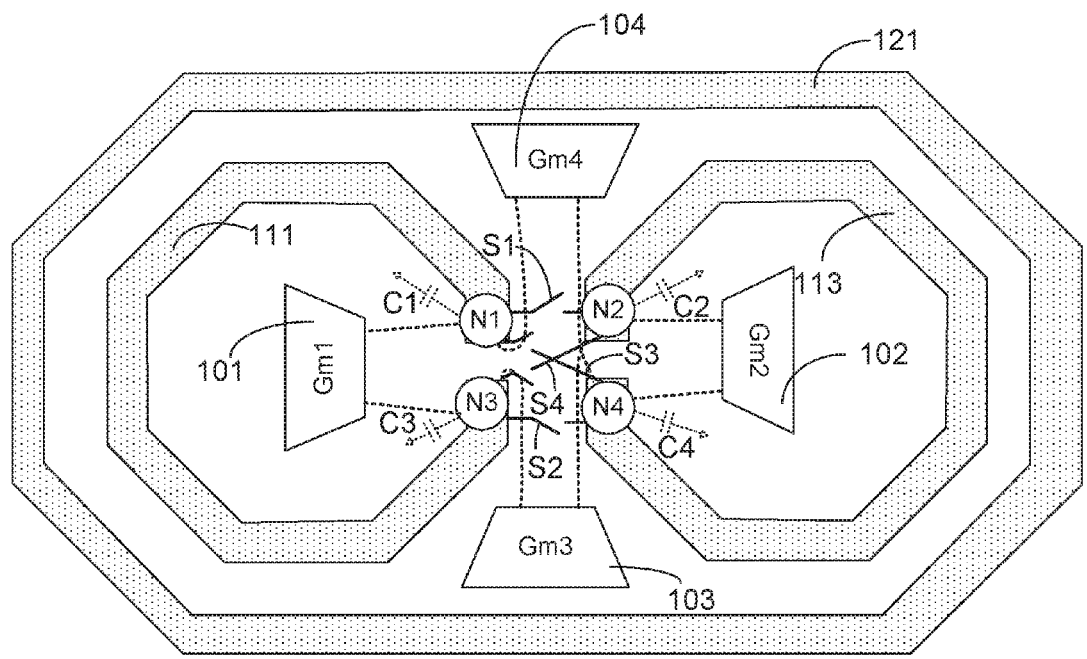
FIG. 1A is a schematic diagram illustrating a configurable signal generator according to the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A signal generator capable of being switched in multiple operation modes is proposed. The signal generator can be used as the DCO in the PLL. By adjusting connections between inductors in the signal generator, the overall inductance ($L_{total}$) of the LC oscillators is configurable. In consequence, resonance frequency of the oscillation signal provided by the signal generator can be changed according to requirement of the communication standards. The signal generator based on such adjustable design can reduce the hardware cost because same inductors can be used in different operation modes of the signal generator. Moreover, other requirement of the DCO design, such as the frequency tuning range, power consumption, phase noise (hereinafter, PN) and phase-noise figure-of-merit (hereinafter, FoM), can be achieved by switching operation mode of the signal generator.

FIG. 1A is a schematic diagram illustrating a configurable signal generator according to the present disclosure. The proposed signal generator can include two portions, a resonator circuit and a core circuit. The resonator circuit further includes inductors, capacitors and a switching circuit including several switches (S1, S2, S3 and S4). All switches (S1, S2, S3 and S4) in the switching circuit and trans-conductance circuits (Gm1, Gm2, Gm3, and Gm4) in the core circuit are electrically connected to at least one of the two interior inductors (L1 and L2) 111, 113 but not the exterior inductor (L3) 121.

As shown in FIG. 1A, two interior inductors (L1 and L2) 111, 113 and one exterior inductor (L3) 121, are designed. The interior inductors (L1 and L2) 111, 113 are symmetric in shape and areas of the interior inductors (L1 and L2) 111, 113 are same. In the present disclosure, the shapes of the interior inductors (L1 and L2) 111, 113 are assumed to be octagonal. The two interior inductors (L1 and L2) 111, 113 are surrounded by the exterior inductor (L3) 121. These inductors can be coils, spirals, or conductive rings and so forth.

The LC oscillators in the signal generator may include at least one of inductors L1 and L2, with capacitors C1, C2, C3 and C4 connected to terminals N1, N2, N3 and N4. LC oscillators are commonly used in RF circuits because of their good phase noise (PN) characteristics and their ease of implementation. The first inductor (L1) 111 has an upper terminal (first terminal, N1) and a lower terminal (third terminal, N3), and the second inductor (L2) has an upper terminal (second terminal, N2) and a lower terminal (fourth terminal, N4). An existing chip ground in an integrated circuit (hereinafter, IC) can be utilized as the exterior inductor (L3). The layout design of an IC is a very delicate and difficult task, and utilization of the existing chip ground can be cost efficient.

The core circuit includes multiple trans-conductance circuits, first trans-conductance circuit (Gm1) 101, second trans-conductance circuit (Gm2) 102, third trans-conductance circuit (G3) 103 and fourth trans-conductance circuit (G4) 104, for starting and sustaining oscillation signal of the LC oscillators. These trans-conductance circuits (Gm1, Gm2, Gm3, and Gm4) 101, 102, 103, 104 may include cross-coupled transistors (PMOS, NMOS, CMOS and so forth). Implementation of these trans-conductance circuits (Gm1, Gm2, Gm3, and Gm4) is not limited to cross-coupled transistors. For example, the trans-conductance circuit may be a combination of transistors and some other active and/or passive components. Being a very important oscillator design parameter, the term negative resistance has been used in the oscillator industry for many years to model the required gain needed to design stable oscillators.

The trans-conductance circuits (for example, cross-coupled transistors) realize a negative resistance, which compensates for the losses of the LC oscillator (or say, tank circuit) and other losses. The negative resistance of the first trans-conductance circuit (Gm1) 101 can compensate an inner oscillation signal generated between the first and the third terminals (N1 and N3). The negative resistance of the second trans-conductance circuit (Gm2) 102 can compensate another inner oscillation signal generated between the second and the fourth terminals (N2 and N4). The negative resistance of the third trans-conductance circuit (Gm3) 103 can compensate an outer oscillation signal generated between the second and the third terminals (N2 and N3). The negative resistance of the fourth trans-conductance circuit (Gm4) 104 can compensate another outer oscillation signal generated between the first and the fourth terminals (N1 and N4). Connections between components and terminals N1, N2, N3 and N4 are summarized and listed in Table 1.

TABLE 1

| terminals | N1 | N2 | N3 | N4 |
|---|---|---|---|---|
| N1 | — | S1 | L1, Gm1 | S3, Gm4 |
| N2 | S1 | — | S4, Gm3 | L2, Gm2 |
| N3 | L1, Gm1 | S4, Gm3 | — | S2 |
| N4 | S3, Gm4 | L2, Gm2 | S2 | — |

Switch S1 is electrically connected to terminals N1 and N2. Switch S2 is electrically connected to terminals N3 and N4. Switch S3 is electrically connected to terminals N1 and N4. Switch S4 is electrically connected to terminals N3 and N2. As shown in FIG. 1A, switches S1 and S2 are placed in parallel, and switches S3 and S4 are placed diagonally and cross each other. By switching these switches (S1, S2, S3, S4), inductors L1 and L2 are selectively bridged or split, and characteristic of resonance caused at the signal generator can be changed.

The first trans-conductance circuit (Gm1) 101 is commonly electrically connected to terminals N1 and N3. The second trans-conductance circuit (Gm2) 102 is commonly electrically connected to terminals N2 and N4. The third trans-conductance circuit (Gm3) is commonly electrically connected to terminals N3 and N2. The fourth trans-conductance circuit (Gm4) 104 is commonly electrically connected to terminals N1 and N4.

Depending on position of the trans-conductance circuits (Gm1, Gm2, Gm3 and Gm4), the first and the second trans-conductance circuits (Gm1 and Gm2) 101, 102 can be classified as inner circuits, and the third and the fourth trans-conductance circuits (Gm3 and Gm4) 103, 104 can be classified as outer circuits. In addition to trans-conductance circuits, the inner circuits and the outer circuits may adopt other types of circuits.

For the sake of convenience, variation and adjustment of capacitances are not illustrated in the present disclosure. The capacitance value of these capacitors (C1, C2, C3 and C4) is assumed to be 2C. Nevertheless, capacitance of capacitors C1, C2, C3 and C4 can be varied. Furthermore, voltage or digital controlled circuit can be adopted for calibration purpose.

Figure 1B:
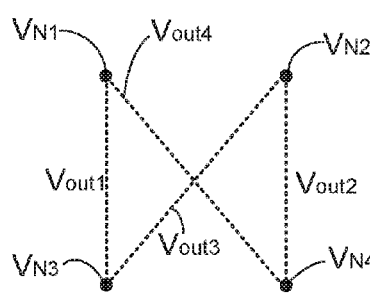
FIG. 1B is a schematic diagram illustrating voltages at terminals N1, N2, N3 and N4, and the oscillation signals in the signal generator.

FIG. 1B is a schematic diagram illustrating voltages at terminals N1, N2, N3 and N4, and the oscillation signals in the signal generator. According to the present disclosure, voltages of terminals N1, N2, N3 and N4 are respectively represented as $V_{N1}$, $V_{N2}$, $V_{N3}$, and $V_{N4}$.

A first oscillation signal ($V_{out1}$) is defined as difference between voltages of terminals N1 and N3, that is, $V_{out1}=(V_{N1}-V_{N3})$. A second oscillation signal ($V_{out2}$) is defined as difference between voltages of terminals N2 and N4, that is, $V_{out2}=(V_{N2}-V_{N4})$. A third oscillation signal ($V_{out3}$) is defined as difference between voltages of terminals N2 and N3, that is, $V_{out3}=(V_{N2}-V_{N3})$. A fourth oscillation signal ($V_{out4}$) is defined as difference between voltages of terminals N1 and N4, that is, $V_{out4}=(V_{N1}-V_{N4})$.

Among these oscillation signals, the first oscillation signal ($V_{out1}$) is corresponding to the first trans-conductance circuit (Gm1); the second oscillation signal ($V_{out2}$) is corresponding to the second trans-conductance circuit (Gm2); the third oscillation signal ($V_{out3}$) is corresponding to the third trans-conductance circuit (Gm3); and the fourth oscillation signal ($V_{out4}$) is corresponding to the fourth trans-conductance circuit (Gm4). Resonance of the LC oscillator causes the aforementioned oscillation signals.

Figure 1C:
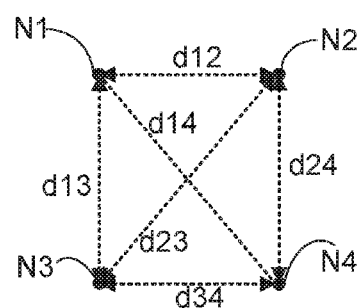
FIG. 1C is a schematic diagram illustrating relative positions of terminals N1, N2, N3 and N4.

FIG. 1C is a schematic diagram illustrating relative positions of terminals N1, N2, N3 and N4. A distance between terminals N1 and N2 (d12) is substantially equivalent to a distance between terminals N3 and N4 (d34), that is, d12=d34. A distance between terminals N1 and N3 (d13) is substantially equivalent to a distance between terminals N2 and N4 (d24), that is, d13=d24. A distance between terminals N1 and N4 (d14) is substantially equivalent to a distance between terminals N2 and N3 (d23), that is, d14=d23. Moreover, positions of the four terminals (N1, N2, N3 and N4) are arranged in a rectangle shape so that the distances d14 and d23 are longer than the distances d12, d34, d13, and d24.

The multiple operation modes provided by the proposed signal generator can include a single loop mode, a parallel coupled mode, a cross coupled mode, and a serial connected mode. According to the requirement of a desired communication standard, the switches in the switching circuit are selectively turned on and/or turned off, and the operation of the trans-conductance circuits (Gm1, Gm2, Gm3, and Gm4) 101, 102, 103, 104 are selectively enabled or disabled respectively.

Depending on the switching statuses of switches S1, S2, S3 and S4 and enablement/disablement of the trans-conductance circuits (Gm1, Gm2, Gm3, and Gm4) 101, 102, 103, 104 in FIG. 1, inductors L1 and L2 are used either individually (single loop mode), in parallel (parallel coupled mode, and cross coupled mode) or serially (serial connected mode). These operation modes are introduced first in Table 2 and will be further illustrated in following figures.

FIGS. 2A, 2B, 3A, 3B, 4A, 4B, 5A and 5B schematically illustrate different operation modes and configuration of the resonator circuit. Each of these figures includes three sections, an upper section representing current flowing through inductors, a middle section representing direction of an induced magnetic field accompanied with the current, and a lower section representing an equivalent circuit of the signal generator. In these figures, direction of the magnetic field is defined by the north end of the induced magnetic field. A "dot" symbol denotes the direction of the magnetic field is directly out of the page, and a "cross" symbol denotes the direction of the magnetic field is directly into the page.

Figure 2A:
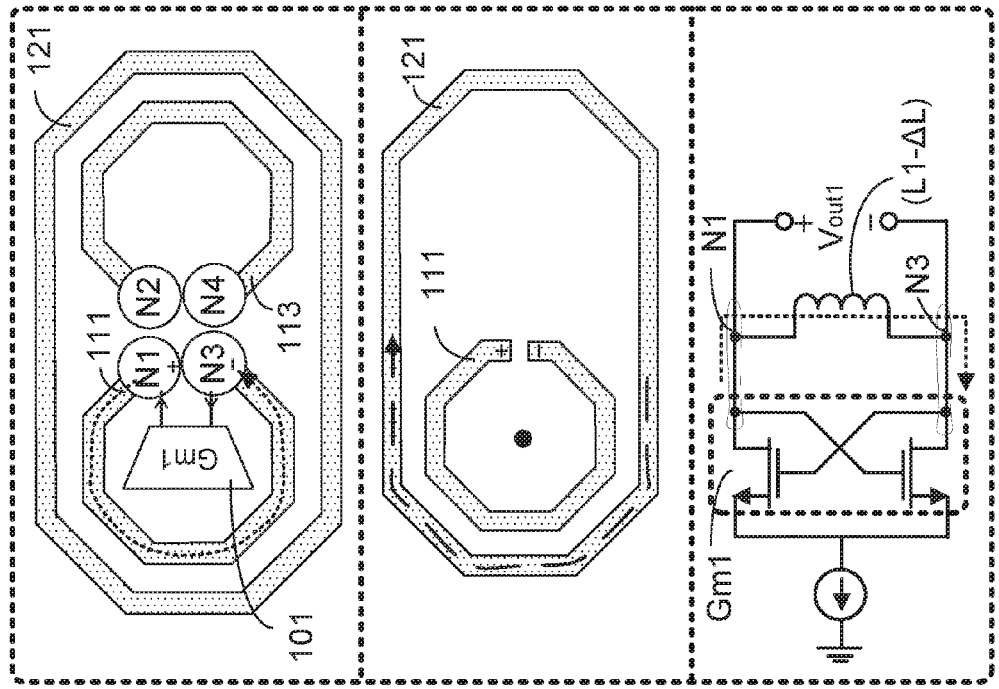
FIGS. 2A and 2B are schematic diagrams illustrating operation of the signal generator when the switching circuit is in the single loop mode (configuration A1).
Figure 2B:
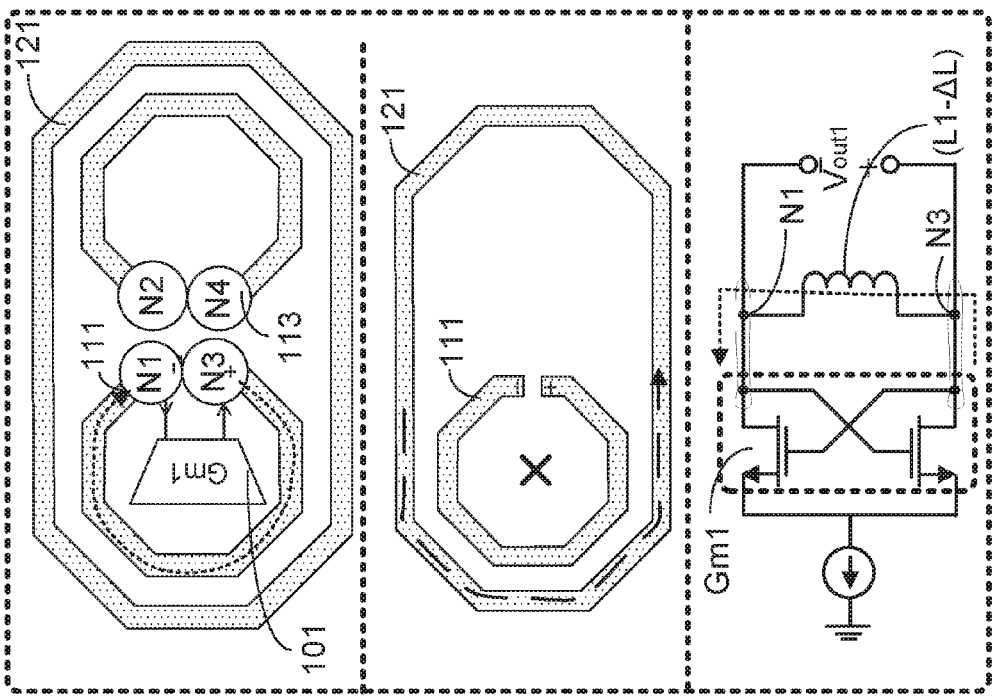

Firstly, the single loop mode is illustrated and can be referred to the first and the second rows in Table 2, together with FIGS. 2A and 2B. When the switching circuit is in the single loop mode (first mode), switches S1, S2, S3 and S4 are all turned off. In the single loop mode, either the first trans-conductance circuit (Gm1) 101 (configuration A1), or the second trans-conductance circuit (Gm2) 102 is in operation (configuration A2).

In an integrated circuit, some circuitry may interfere or be interfered with the signal generator during the operation of the RF apparatus. The relative distance between an interference source and an interfered component is related to the coupling effect. The further the relative distance is, the less coupling interference is caused. In a case that an interference source is relatively far from inductor L1 111 and relatively close to inductor L2 113, configuration A1 can be selected. Alternately, in a case that the interference source is relatively close to inductor L1 111 and relatively far from inductor L2 113, configuration A2 can be selected. That is, the signal generator is less affected by the interference source or make less interference to other circuitry. Due to the symmetry between configurations A1 and A2, details of configuration A2 are not illustrated to avoid verbosities.

FIGS. 2A and 2B are schematic diagrams illustrating operation of the signal generator when the switching circuit is in the single loop mode (configuration A1). Based on configuration A1, the first trans-conductance circuit (Gm1) 101 is enabled and the second, the third, and the fourth trans-conductance circuits (Gm2, Gm3, Gm4) 102, 103, 104 are disabled. Moreover, the voltages of terminals N1 and N3 ($V_{N1}$ and $V_{N3}$) are opposite in sign when the signal generator is in the single loop mode.

In the upper section of FIG. 2A, voltage of terminal N1 ($V_{N1}$) is assumed to be negative, and voltage of terminal N3 ($V_{N3}$) is assumed to be positive. Accordingly, a current flows through inductor L1 111 in clockwise direction. In the middle section of FIG. 2A, the clockwise current induces a magnetic field directly into the page, and an induced current

TABLE 2

| operation mode | configuration | switches | | | | trans-conductance circuit | | | |
|---|---|---|---|---|---|---|---|---|---|
| | | S1 | S2 | S3 | S4 | Gm1 | Gm2 | Gm3 | Gm4 |
| single loop mode | A1 | OFF | OFF | OFF | OFF | ON | OFF | OFF | OFF |
| | A2 | OFF | OFF | OFF | OFF | OFF | ON | OFF | OFF |
| parallel coupled mode | B | ON | ON | OFF | OFF | ON | ON | OFF | OFF |
| cross coupled mode | C | OFF | OFF | ON | ON | ON | ON | OFF | OFF |
| serial connected mode | D1 | OFF | OFF | ON | OFF | OFF | OFF | ON | OFF |
| | D2 | OFF | OFF | OFF | ON | OFF | OFF | OFF | ON | flowing in a counterclockwise direction is generated at inductor L3 121. Therefore, the magnetic field generated at inductor L1 111 is slightly affected by the induced magnetic change generated at inductor L3 121. In the lower section of FIG. 2A, an upward current occurs and the equivalent inductance of the signal generator is represented as (L1-ΔL), and ΔL represents the mutual induced magnetic change caused at inductor L3.

The resonance frequency in the signal generator can be obtained by equation (1). In equation (1), ω is the resonance frequency, $L_{total}$ is the overall inductance, and C is the overall capacitance in the signal generator, $$\omega = \frac{1}{\sqrt{L_{total} \times C}} \quad \text{equation (1)}$$

According to the present disclosure, the configuration of the switching circuit is adjustable, and switching of the switching circuit results in changes of the overall inductance $L_{total}$. The capacitance values can also be adjusted, but are not further discussed for simplicity purpose.

The inductance value of the first and the second inductors is assumed to be "L". In the single loop mode, the overall inductance $L_{total}$ can be represented as L ($L_{total}$=L) because only one of the inductors L1 and L2 is in use. Accordingly, the resonance frequency of the signal generator in the single loop mode (configurations A1 and A2), $\omega_a$, can be obtained by equation (2).

$$\omega_a = \frac{1}{\sqrt{L \times C}} \quad \text{equation (2)}$$

The voltage polarities at terminals N1 and N3 in FIGS. 2A and 2B are opposite. Therefore, the current direction and magnetic fields in FIGS. 2A and 2B are symmetric and opposite. Details about FIG. 2B are symmetric to those of FIG. 2A, and are not redundantly described herein.

Figure 3A:
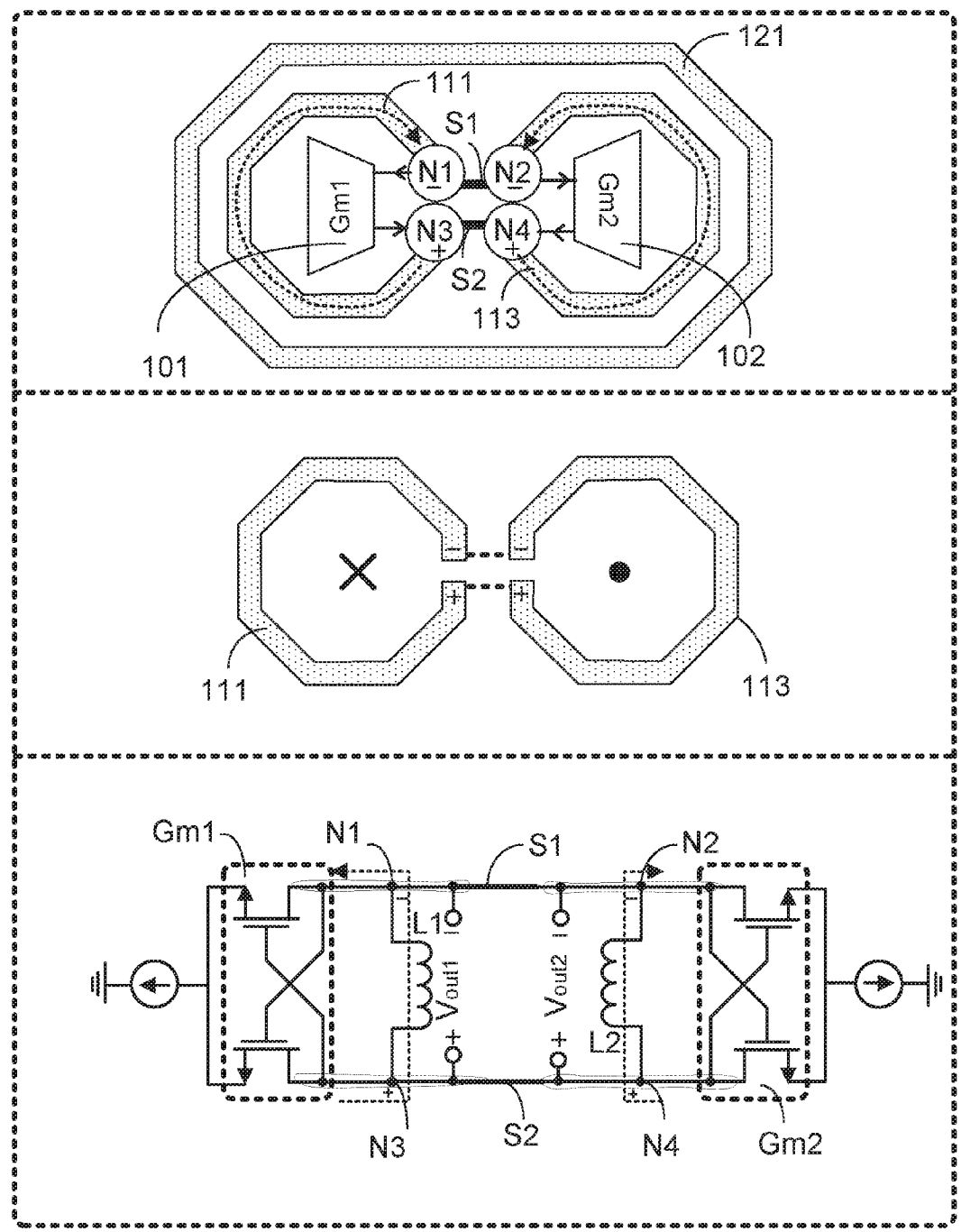
FIGS. 3A and 3B are schematic diagrams illustrating operation of the signal generator when the switching circuit is in the parallel coupled mode (configuration B).
Figure 3B:
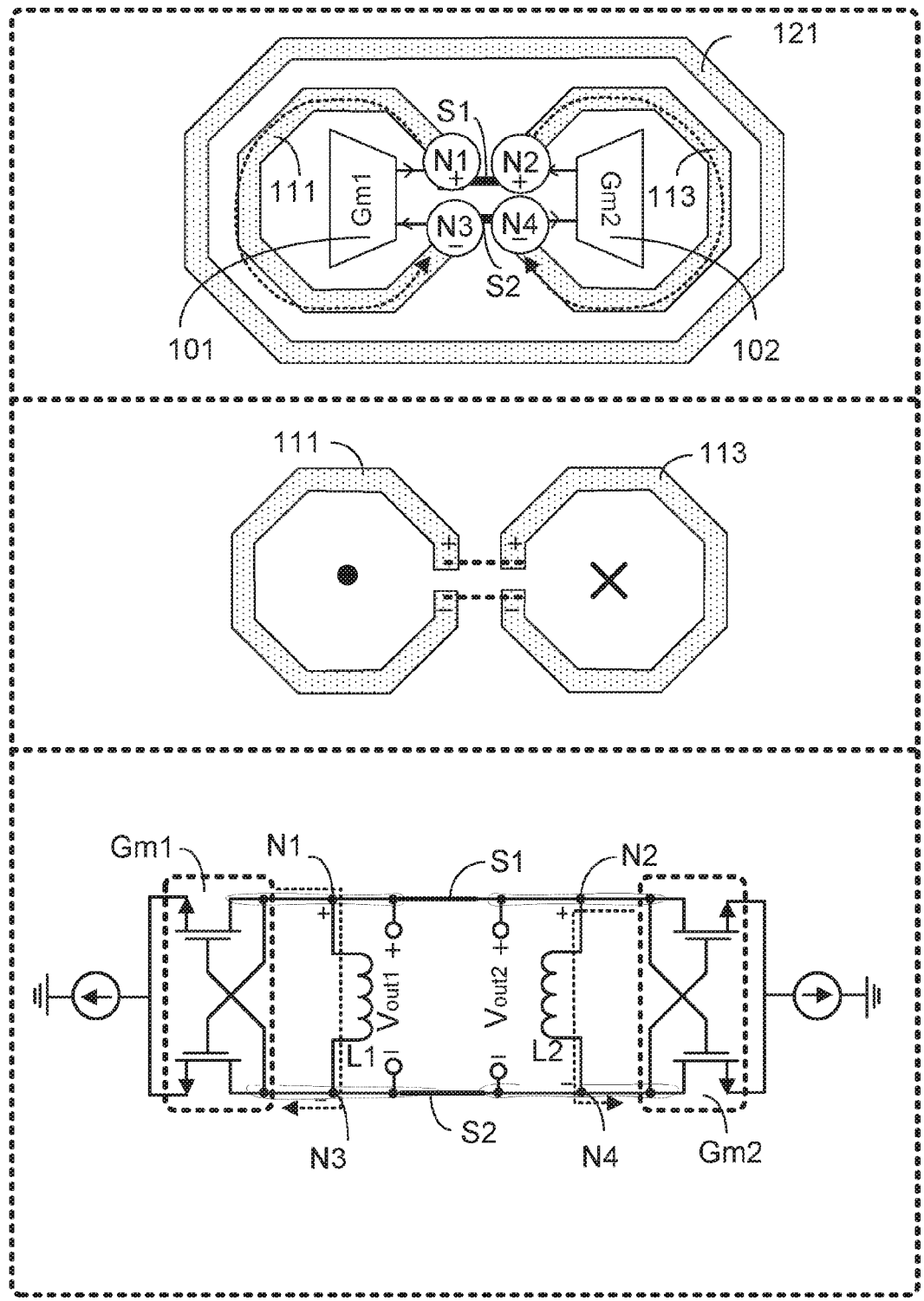

Secondly, the parallel coupled mode is illustrated and can be referred to the third row in Table 2, together with FIGS. 3A and 3B. When the switching circuit is in the parallel coupled mode, the first oscillation signal $V_{out1}$ and the second oscillation signal $V_{out2}$ are substantially in-phase.

FIGS. 3A and 3B are schematic diagrams illustrating operation of the signal generator when the switching circuit is in the parallel coupled mode (configuration B). When the switching circuit is in the parallel coupled mode (second mode), switches S1 and S2 are turned on, and switches S3 and S4 are turned off. The first and the second trans-conductance circuits (Gm1 and Gm2) 101, 102 are enabled, and the third and the fourth trans-conductance circuits (Gm3 and Gm4) 103, 104 are disabled. Moreover, the voltages of terminals N1 and N3 ($V_{N1}$ and $V_{N3}$) are opposite in sign, and the voltages of terminals N2 and N4 ($V_{N2}$ and $V_{N4}$) are opposite in sign.

In the upper section of FIG. 3A, voltages of terminals N3 and N4 ($V_{N3}$ and $V_{N4}$) are assumed to be positive, and voltages of terminals N1 and N2 ($V_{N1}$ and $V_{N2}$) are assumed to be negative. Accordingly, a clockwise current flows through inductor L1, and a counterclockwise current flows through inductor L2. In the middle section of FIG. 3A, an inward magnetic field is induced by the current flowing through inductor L1 111 and an outward magnetic field is induced by the current flowing through inductor L2 113. That is, the current flowing through inductor L1 111 and the current flowing through inductor L2 113 are symmetric and two magnetic fields having opposite directions are generated. Therefore, a field cancellation occurs in the parallel coupled mode. The mirror symmetry of the currents in the parallel coupled mode ensures that no current is induced at inductor L3 121. Due to mirror symmetry inherent in the parallel coupled mode, the signal generator ideally can reject any external magnetic interference.

In the lower section of FIG. 3A, an upward current occurs at the left portion and another upward current occurs at the right portion. The equivalent inductance of the left portion and the right portion of the signal generator are represented as L1 and L2, respectively. Because terminals N1 and N2 are connected via switch S1, and terminals N3 and N4 are connected via switch S2, inductors L1 and L2 111, 113 can be considered as being electrically connected in parallel.

It should be noted that, although switches S1 and S2 are turned on so that terminals of inductors L1 and L2 are connected to each other, no current passes through any of switches S1 and S2. That is, neither the first oscillation signal ($V_{out1}$) is passed to terminals N2 and N4 (through switches S1 and S2), nor the second oscillation signal ($V_{out2}$) is passed to terminals N1 and N3 (through switches S1 and S2). Therefore, switches S1 and S2 do not cause signal loss to the first and the second oscillation signals ($V_{out1}$ and $V_{out2}$).

Because inductors L1 and L2 are connected in parallel when the signal generator is in the parallel coupled mode, the overall inductance $L_{total}$ is substantially equivalent to 0.5 L ($L_{total}$=0.5 L). The resonance frequency in the parallel coupled mode (configuration B), $\omega_b$, can be obtained by equation (3).

$$\omega_b = \frac{1}{\sqrt{0.5L \times 2C}} \quad \text{equation (3)}$$

The voltage polarities at terminals N1, N2, N3 and N4 in FIGS. 3A and 3B are opposite. Therefore, the current direction and magnetic field in FIGS. 3A and 3B are symmetric and opposite. Details about FIG. 3B are symmetric to those of FIG. 3A, and are not redundantly described herein Thirdly, the cross coupled mode is illustrated and can be referred to the fourth row in Table 2, together with FIGS. 4A and 4B. When the signal generator is in the cross coupled mode, the first oscillation signal $V_{out1}$ and the second oscillation signal $V_{out2}$ are substantially 180° out of phase.

Figure 4A:
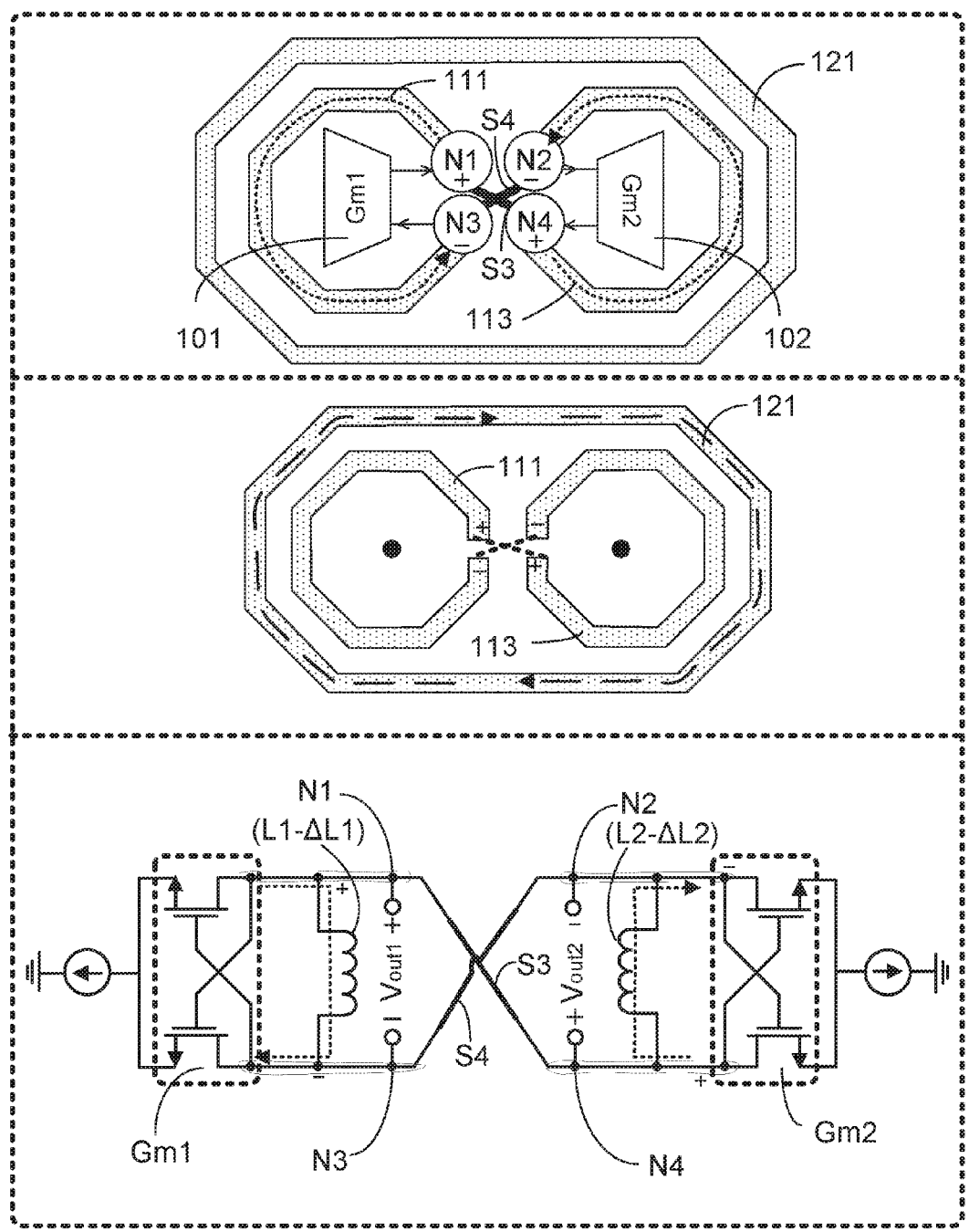
FIGS. 4A and 4B are schematic diagrams illustrating operation of the signal generator when the switching circuit is in the cross coupled mode (configuration C).
Figure 4B:
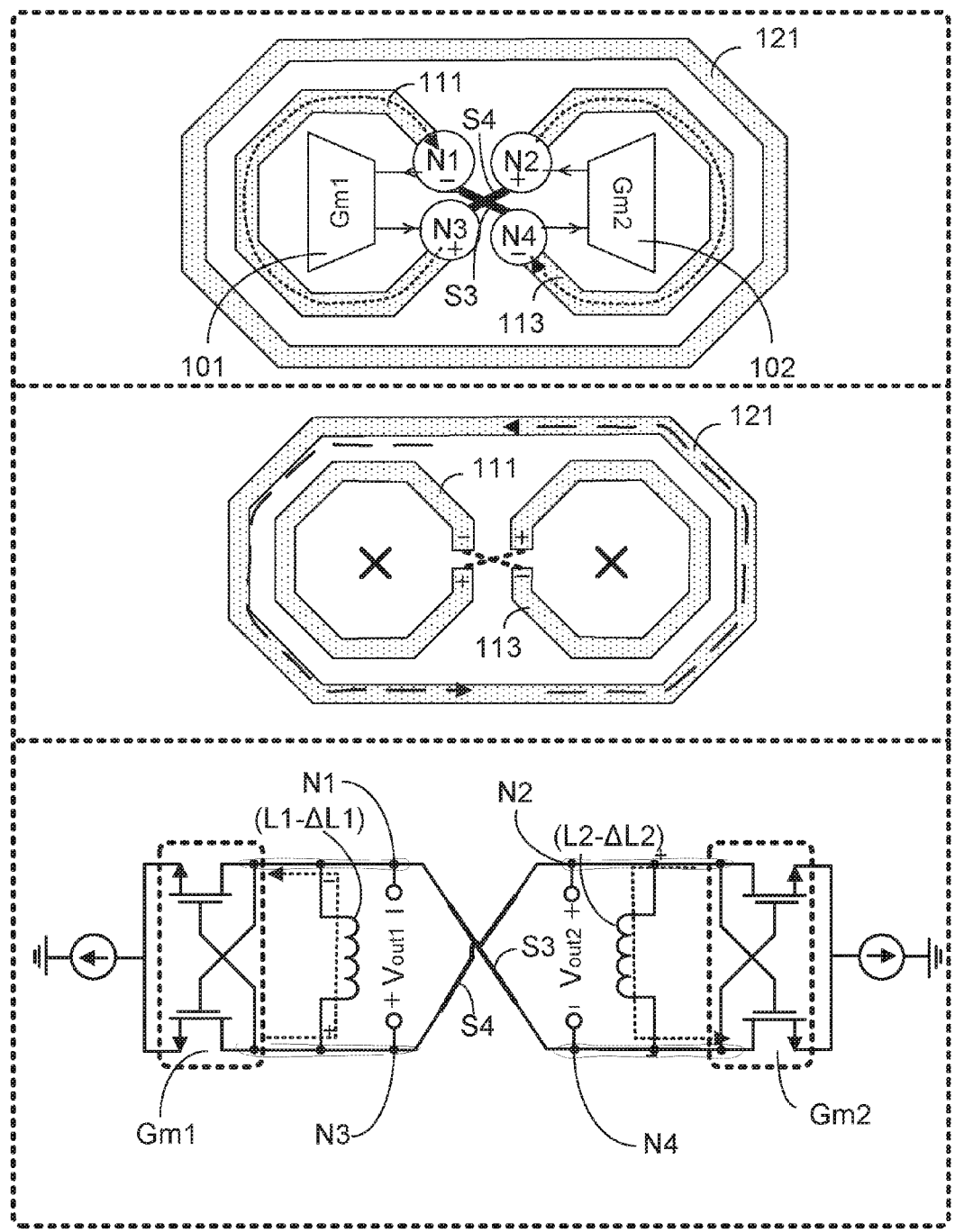

FIGS. 4A and 4B are schematic diagrams illustrating operation of the signal generator when the switching circuit is in the cross coupled mode (configuration C). When the switching circuit is in the cross coupled mode (third mode), switches S1 and S2 are turned off, and switches S3 and S4 are turned on. The first and the second trans-conductance circuits (Gm1 and Gm2) 101, 102 are enabled, and the third and the fourth trans-conductance circuits (Gm3 and Gm4) 103, 104 are disabled. Moreover, the voltages of terminals N1 and N3 ($V_{N1}$ and $V_{N3}$) are opposite in sign, and the voltages of terminals N2 and N4 ($V_{N2}$ and $V_{N4}$) are opposite in sign.

In the upper section of FIG. 4A, voltages of terminals N1 and N4 (VN1 and VN4) are assumed to be positive, and voltages of terminals N2 and N3 (VN2 and VN3) are assumed to be negative. Accordingly, a counterclockwise current flows through inductor L1, and a clockwise current flows through inductor L2. That is, when the switching circuit is in the cross coupled mode, direction of currents flowing through inductor L1 and inductor L2 are consistent. In the middle section of FIG. 4A, an outward magnetic field is induced by the current flowing through inductor L1 111, and another outward magnetic field is induced by the current flowing through second inductor L2 113. The current flowing through inductor L1 111 and the current flowing through inductor L2 113 are accompanied by induced current in inductor L3. The induced current in inductor L3 further causes an induced magnetic field whose direction is directly into the page.

In the lower section of FIG. 4A, a downward current occurs at the left portion and an upward current occurs at the right portion. The equivalent inductance of the left portion and the right portion of the signal generator are represented as (L1-ΔL1) and (L2-ΔL2), respectively. The induced magnetic changes ΔL1 and ΔL2 represent the mutual induced magnetic changes that the induced current flowing through inductor L3 caused at inductor L1 and L2, respectively. The induced magnetic changes ΔL1 and ΔL2 can be substantially equivalent (ΔL1=ΔL2=M). Inductors L1 and L2 are connected in parallel and the inductance of inductors L1 and L2 are respectively subtracted by the mutual inductance, M. Therefore, the overall inductance $L_{total}$, of the signal generator in FIGS. 4A and 4B can be represented as [(L−M)// (L−M)]=0.5·(L−M). Accordingly, the resonance frequency in the cross coupled mode (configuration C), $\omega_c$, can be obtained by equation (4).

$$\omega_c = \frac{1}{\sqrt{0.5(L-M) \times 2C}} \quad \text{equation (4)}$$

It should be noted that, although switches S3 and S4 are turned on so that terminals of inductors L1 and L2 are connected to each other, no current passes through any of switches S3 and S4. That is, neither the first oscillation signal ($V_{out1}$) is passed to terminals N2 and N4 (through switches S3 and S4), nor the second oscillation signal (Vout2) is passed to terminals N1 and N3 (through switches S3 and S4). Therefore, switches S3 and S4 do not cause signal loss to the first and the second oscillation signals ($V_{out1}$ and $V_{out2}$).

The voltage polarities at terminals N1, N2, N3 and N4 in FIGS. 4A and 4B are opposite. Therefore, the current direction and magnetic field in FIGS. 4A and 4B are symmetric and opposite. Details about FIG. 4B are symmetric to those of FIG. 4A, and are not redundantly described herein.

Figure 5A:
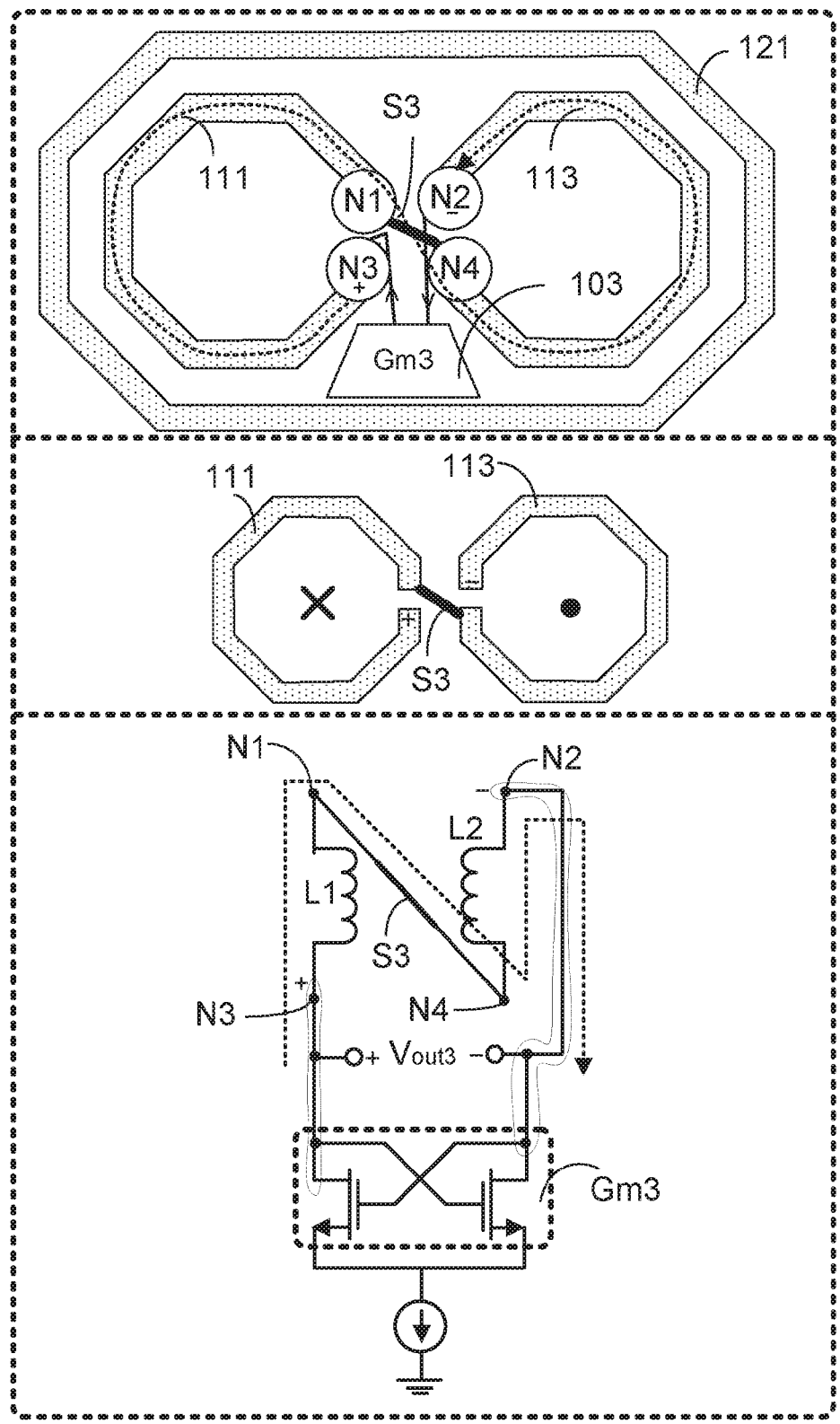
FIGS. 5A and 5B are schematic diagrams illustrating operation of the signal generator when the switching circuit is in the serial connected mode (configuration D1).
Figure 5B:
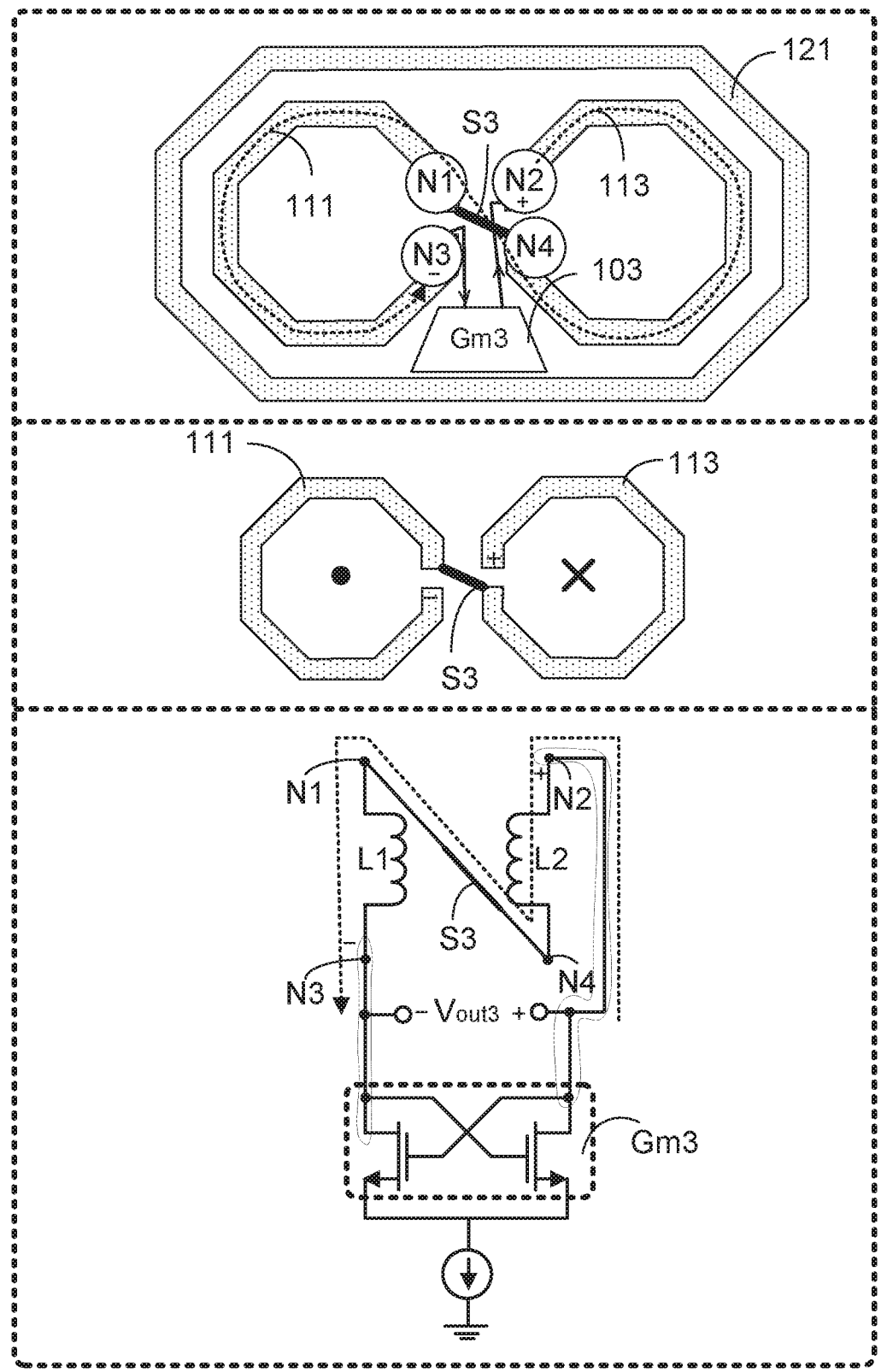

Fourthly, the serial connected mode is illustrated and can be referred to the fifth and the sixth rows in Table 2, together with FIGS. 5A and 5B. When the switching circuit is in the serial connected mode (fourth mode), switches S1 and S2 are turned off, one of switches S3 and S4 is turned on and the other of switches S3 and S4 is turned off. In the serial connected mode, either the third trans-conductance circuit (Gm3) 103 is enabled and switch S3 is turned on (configuration D1), or the fourth trans-conductance circuit (Gm4) 104 is enabled and switch S4 is turned on. Due to the symmetry between configurations D1 and D2, details of configuration D2 are not illustrated to avoid verbosities.

FIGS. 5A and 5B are schematic diagrams illustrating operation of the signal generator when the switching circuit is in the serial connected mode (configuration D1). In FIGS. 5A and 5B, the third trans-conductance circuit (Gm3) is enabled and the first, the second and the fourth trans-conductance circuits (Gm1, Gm2, Gm4) 101, 102, 104 are disabled. Moreover, the voltages at terminals N3 and N2 are opposite in sign.

In the upper section of FIG. 5A, a current flowing through inductors L1 and L2 is in an 8-shape. According to this figure, the current firstly flows clockwise through terminal N3, inductor L1 111 and terminal N1, passes through switch S3, and then flows through terminal N4, inductor L2 113 and terminal N2 in counterclockwise direction. In the middle section of FIG. 5A, an induced magnetic field with direction into the page is caused by the current flowing through inductor L1 111, and another induced magnetic field with direction out of the page is caused by the current flowing through inductor L2 113. That is, the current flowing through inductor L1 111 and the current flowing through inductor L2 113 are symmetric and two induced magnetic fields having opposite directions are generated. Therefore, a field cancellation occurs in the serial connected mode. In the lower section of FIG. 5A, voltage of terminal N3 ($V_{N3}$) is positive, and voltage of terminal N2 ($V_{N2}$) is negative. A current started from terminal N3 firstly flows upward via inductor L1. Then, the current flows through switch S3 to terminal N4. Later, the current flows upward to terminal N2. The third oscillation signal ($V_{out3}$) is generated accordingly.

In the serial connected mode, the third oscillation signal ($V_{out3}$) is transmitted through switch S3 (configuration D1), or the fourth oscillation signal ($V_{out4}$) is transmitted through switch S4 (configuration D2). The oscillation signal is conducted through switch S3 or S4 and signal loss may occur. The signal loss caused in serial connected mode is similar to the loss caused while charging and discharging capacitors in a switched capacitor array (hereinafter, SCA).

In the serial connected mode, the overall inductance $L_{total}$ can be obtained by summing inductance of inductors L1 and L2 ($L_{total}$=L1+L2=2L). The resonance frequency in the serial connected mode, $\omega_d$, can be obtained by equation (5).

$$\omega_d = \frac{1}{\sqrt{2L \times C}} \quad \text{equation (5)}$$

The voltage polarities at terminals N2 and N3 in FIGS. 5A and 5B are opposite. Therefore, the current direction and magnetic field in FIGS. 5A and 5B are symmetric and opposite. Relatively, no signal exists in terminals N1 and N4 in FIGS. 5A and 5B. Details about FIG. 5B are symmetric to those of FIG. 5A, and are not redundantly described herein.

The present disclosure concerns different requirement of the DCO design, such as the frequency tuning range, power consumption, PN and Fail, and the proposed signal generator may operate in different operation modes in response to requirement of the communication standard. Each of the aforementioned operation modes is corresponding to different characteristics. For example, the single loop mode is suitable for low power purpose, the parallel coupled mode is suitable for high performance purpose, the cross coupled mode is suitable for providing higher resonance frequency, and the serial connected mode is suitable for providing lower resonance frequency. In other words, the mode-switching approach can ease the tradeoff between concerns about performance, power consumption and so forth. Details about selection of operation mode can be referred to FIGS. 6, 7, 8A and 8B.

The phase noise (PN) is one of the most important performance characteristics in the oscillator design. It will influence the jitter from the output waveform in the time domain. Thus, cellular standards have very stringent phase noise requirements. The phase noise (PN) is defined in equation (6). According to equation (6), PN is inversely proportional to capacitance (C), quality factor of the inductor (Q), and square of voltage ($V^2$).

$$PN \propto \frac{1}{C \times Q \times V^2} \quad \text{equation (6)}$$

Figure 6:
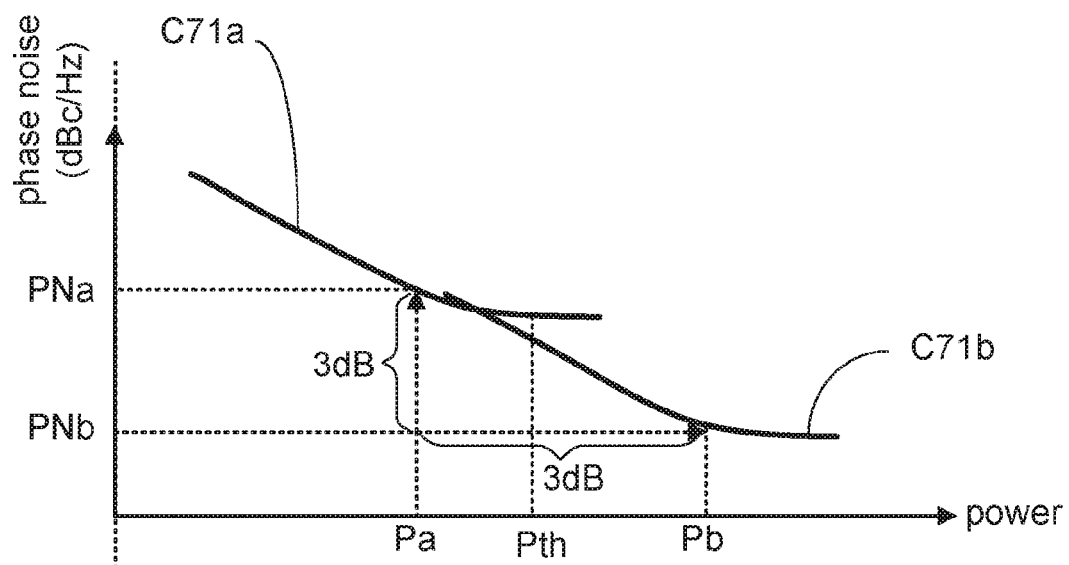
FIG. 6 is a schematic diagram illustrating waveform representing relationship between phase noise and power consumption.

FIG. 6 is a schematic diagram illustrating waveform representing phase noise versus power. The vertical axis represents the phase noise (PN) and the horizontal axis represents the power consumption. Basically, a smaller phase noise (PN) requires higher power consumption.

In FIG. 6, the left curve C71a is corresponding to the phase noise (PN) in the single loop mode, and the right curve C71b is corresponding to the phase noise (PN) in the parallel coupled mode. As shown in FIG. 6, the PN of the signal generator when the switching circuit is in the parallel coupled mode is much better than that in the single loop mode. Only one trans-conductance circuit is in use when the switching circuit is in the single loop mode, and two trans-conductance circuits are in use when the switching circuit is in the parallel coupled mode. The phase noise (PN) was proved in theory to scale down if multiple oscillators are ideally coupled, and this can be verified by FIG. 6.

The power consumption Pa is corresponding to phase noise PNa, and the power consumption Pb is corresponding to phase noise PNb. Phase noise PNa is higher than phase noise PNb. The left curve C71a shows that once the power consumption of the signal generator is greater than or equivalent to Pa (P≥Pa), increment of power consumption no longer contributes decrement of phase noise (PN). That is, the single loop mode is relatively suitable for low power consumption purpose. On the other hand, the right curve C71b shows that the parallel coupled mode is relatively suitable for low PN applications.

In practical application, a power threshold value (Pth) can be selected. When lower power consumption is required, the signal generator operates in the single loop mode. Otherwise, the signal generator switches to the parallel coupled mode, and vice versa. The selection of the power threshold value (Pth) is adjustable and not limited.

FoM can be considered as a type of quality parameter and constant FoM is preferred in a wider range of power consumption. FoM is defined in equation (7). In equation (7), $f_0$ is the resonance frequency, $\Delta f$ is the offset frequency, PN($\Delta f$) is the phase noise (PN) in dBc/Hz, and $P_{mW}$ is the power consumption in mille-watt (mW).

$$FoM = 10\log_{10}\left(\frac{1}{P_{mW}} \times \left(\frac{f_0}{\Delta f}\right)^2\right) - PN(\Delta f) \quad \text{equation (7)}$$

Figure 7:
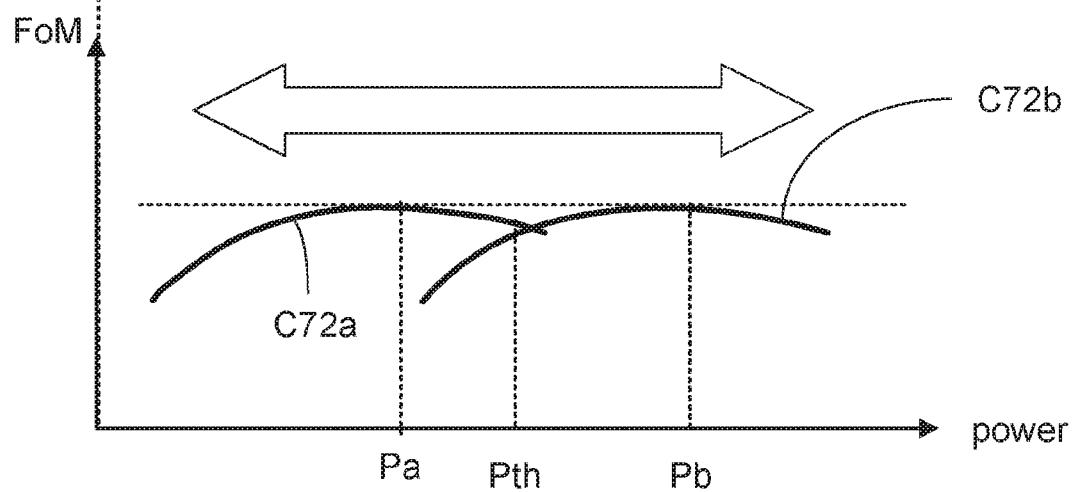
FIG. 7 is a schematic diagram illustrating waveform representing relationship between figure-of-merit and resonance frequency in the single loop mode and the parallel connected mode.

FIG. 7 is a schematic diagram illustrating waveform representing FoM versus power in the single loop mode and the parallel connected mode. The vertical axis represents FoM and the horizontal axis represents power consumption. In FIG. 7, the left curve C72a is corresponding to the FoM in the single loop mode, and the right curve C72b is corresponding to the FoM in the parallel coupled mode. The FoM in the single loop mode is roughly constant when the power consumption is lower than the power threshold value Pth, and the FoM in the parallel coupled mode is roughly constant when the power consumption is greater than the power threshold value Pth.

Please refer to FIGS. 6 and 7 together. The constant ranges of the FoM curves in FIG. 7 are generally consistent with the linear range of the PN curves shown in FIG. 6. That is, between the powerconsumption Pa and the power consumption Pb. Therefore, by switching in between the single loop mode and the parallel coupled mode, the FoM can basically remain constant in a wide range of power consumption. The double arrow in FIG. 7 represents that the constant range of the FoM extends with the mode switching.

Figure 8A:
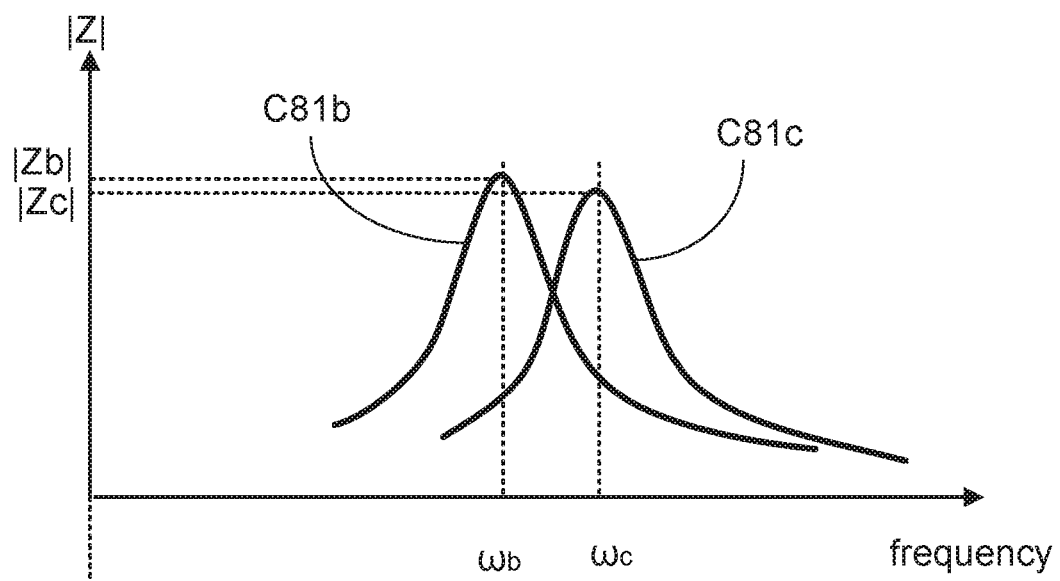
FIG. 8A is a schematic diagram illustrating comparison of the relationship between impedance and resonance frequency of the signal generator in the parallel coupled mode and the cross coupled mode.

FIG. 8A is a schematic diagram illustrating comparison of LC tank impedance |Z| versus resonance frequency in the parallel coupled mode and the cross coupled mode. The LC tank impedance is decided by inductor and capacitor loss, but the capacitor loss is assumed to be constant for simplified analysis. In FIG. 8A, the left curve C81b is corresponding to the impedance of the signal generator in the parallel coupled mode, and the right curve C81c is corresponding to the impedance of the signal generator in the cross coupled mode. The resonance frequency in the parallel coupled mode ($\omega_b$) is corresponding to the maximum (peak) impendence |Zb| of the left curve C81b, and the resonance frequency in the cross coupled mode ($\omega_c$) is corresponding to the maximum (peak) impendence |Zc| of the right curve C81c. The shift of the resonance frequencies between the parallel coupled mode and the cross coupled mode is caused by the mutual inductance at inductor L.B. In addition, the maximum (peak) impendence of the left curve C81b (|Zb|) is slightly higher than the maximum (peak) impendence in the cross coupled mode |Zc|), that is, |Zb|>|Zc|. The difference between |Zb| and |Zc| is because the exterior inductor (L3) makes the mutual inductance (M) lose a little energy in the cross coupled mode.

Please refer to equations (3) and (4) again, the coefficient of inductance (L) in equation (3) and (4) are both equivalent to "0.5", but the inductor L in equation (4) is subtracted by the mutual inductance change "M". The subtraction of the mutual inductance change M causes slight shift (offset) of the resonance frequency. According to equations (3) and (4), the resonance frequency $\omega_b$ in the parallel coupled mode is lower than the resonance frequency $\omega_c$ in the cross coupled mode. Obviously, if the mutual inductance change M becomes larger, the resonance frequency $\omega_c$ in the cross coupled mode becomes higher, but the maximum (peak) impendence |Zc| becomes lower. Therefore, the plot in FIG. 8A is consistent with comparison between equations (3) and (4).

Figure 8B:
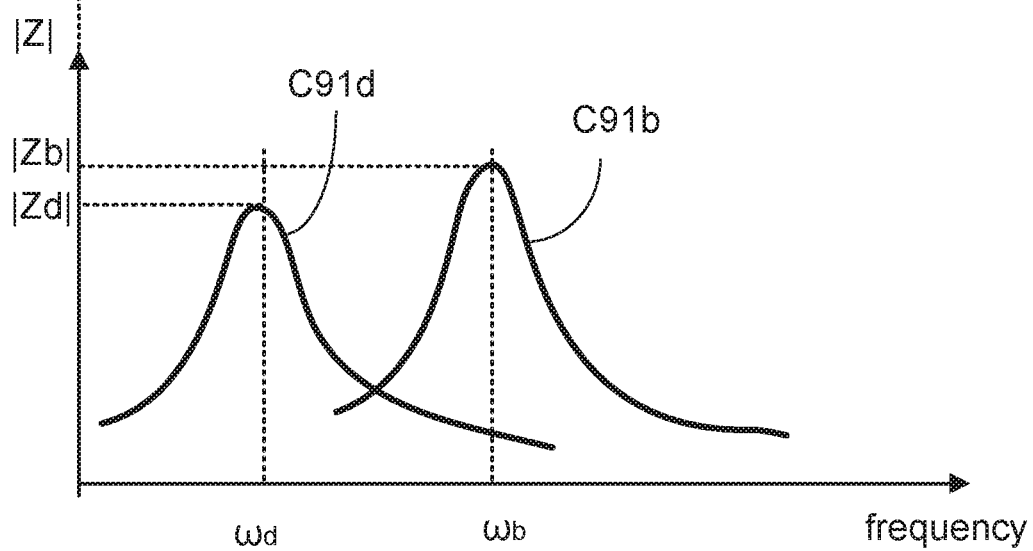
FIG. 8B is a schematic diagram illustrating comparison of relationship between impedance and resonance frequency of the signal generator in the parallel coupled mode and the serial connected mode.

FIG. 8B is a schematic diagram illustrating comparison of impedance versus resonance frequency in the parallel coupled mode and the serial connected mode. In FIG. 8B, the left curve C91d and the right curve C91b are respectively corresponding to the impedance of the signal generator in the serial connected mode, and in the parallel coupled mode. The resonance frequency in the parallel coupled mode ($\omega_b$) is corresponding to the maximum impendence (peak) |Zb| of the right curve C91b, and the resonance frequency in the serial connected mode ($\omega_d$) is corresponding to the maximum impendence (peak) |Zd| of the left curve C91d.

According to equations (3) and (5), the resonance frequency $\omega_d$ in serial connected mode is much lower than the resonance frequency $\omega_b$ in the parallel coupled mode ($\omega_d$=1/$\sqrt{2}$*$\omega_b$). As shown in FIG. 8B, the resonance frequency in the serial connected mode ($\omega_b$) is distinguishably lower than the resonance in the parallel coupled mode ($\omega_d$). That is, $\omega_d < \omega_b$. Therefore, the plot in FIG. 8B is consistent with comparison between equations (3) and (5).

As shown in FIG. 8B, the maximum (peak) impedance |Zb| in the parallel coupled mode is much higher than the maximum (peak) impedance |Zd| in the serial connected mode, wherein the significant drop of the impedance in the serial connected mode |Zd| is originated from the signal loss at switch S3 or S4. The present disclosure proposes the signal generator capable of being switched in different operation modes, and the most appropriate operation mode can be freely selected and determined depending on which of the characteristics is the main concern. These operation modes can be compared in a comprehensive manner, and an appropriate operation mode of the signal generated can be selected accordingly. Therefore, the signal generator is with flexible usage.

The phase noise (PN) of the signal generator in the parallel coupled mode and in the cross coupled mode are similar, and both are lower than that in the single loop mode, which is lower than that in the serial connected mode. Therefore, the parallel coupled mode and the cross coupled mode are more appropriate for the requirement of low phase noise (PN).

The FoM of the signal generator in the parallel coupled mode and in the single loop mode are similar, and both are greater than that in the cross coupled mode, which is greater than that in the serial connected mode. Accordingly, the parallel coupled mode and the single loop mode are more appropriate for the high FoM requirement.

The impedance of the signal generator in the parallel coupled mode and in the cross coupled mode are similar, and both are less than that in the single loop mode, which is less than that in the serial connected mode. Consequentially, the parallel coupled mode and the cross coupled mode are more appropriate for the requirement of low impedance.

The frequency tuning range of the signal generator in the serial connected mode is lower than that in the parallel coupled mode, which is lower than that in the single loop mode. Furthermore, the frequency tuning range of the signal generator in the single loop mode is lower than that in the cross coupled mode. As a result, the serial connected mode is the most appropriate for the requirement of low frequency tuning range.

Figure 9:
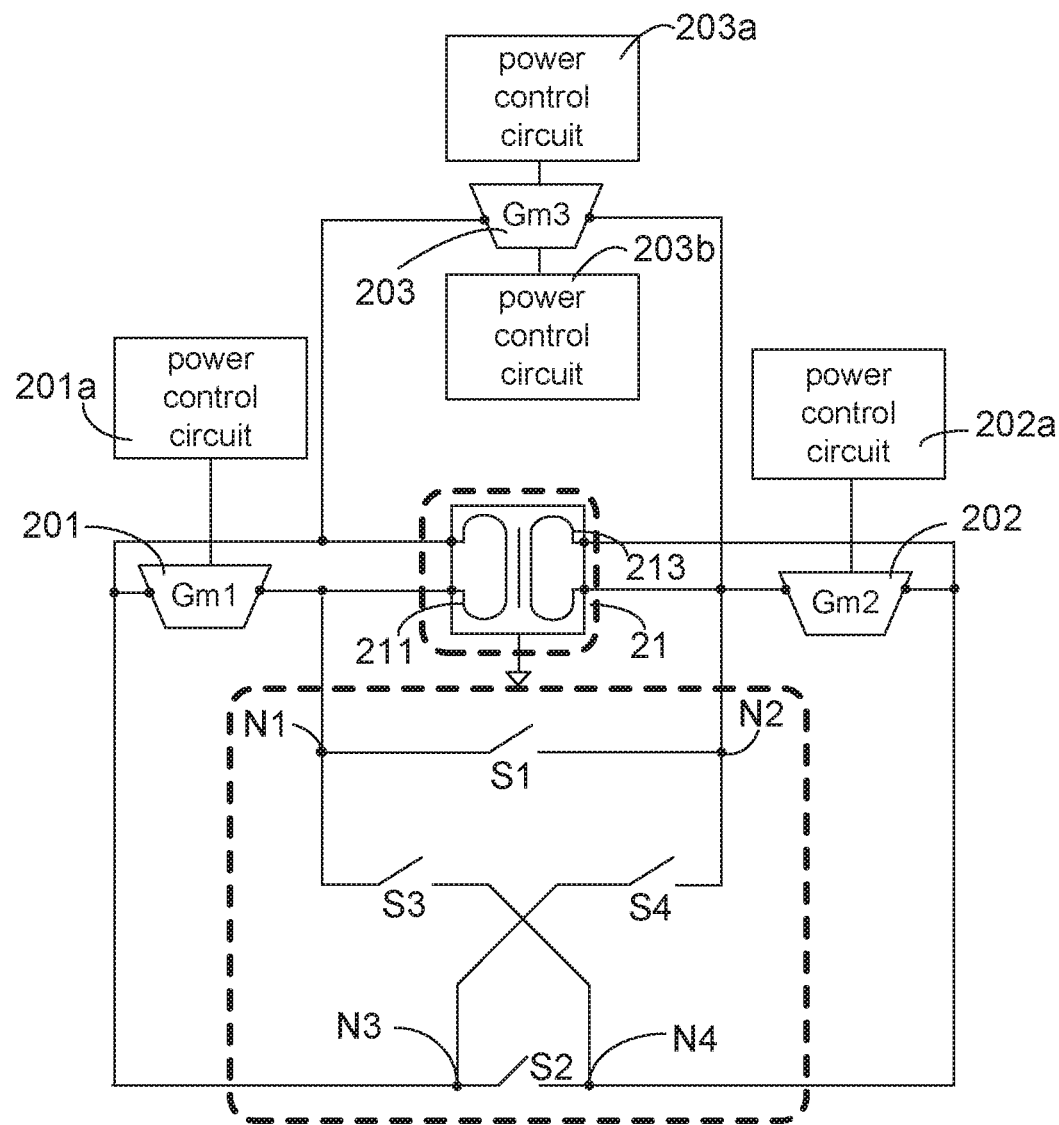
FIG. 9 is a schematic diagram illustrating adoption of the power control circuit.

The design and implementation of the trans-conductance circuits (Gm1, Gm2, Gm3, and Gm4) are not necessary to be identical. Therefore, the trans-conductance circuits (Gm1, Gm2, Gm3 and Gm4) may correspond to different resonance frequencies. For example, the first oscillation signal ($V_{out1}$) may be used for 3G application, and the second oscillation signal ($V_{out2}$) may be used for 2G application. In some applications, it is possible to implement only one of the third and the fourth trans-conductance circuits (Gm3 and Gm4). In FIG. 9, the fourth trans-conductance circuit (Gm4) is assumed to be omitted.

FIG. 9 is a schematic diagram illustrating adoption of the power control circuit. Please refer to FIGS. 1A and 9 together. Although position of the third trans-conductance circuit (Gm3) 203 in FIG. 9 is slightly different from that in FIG. 1A, the connection relationships between the third trans-conductance circuit (Gm3) and terminals of the switching circuit remain consistent. In FIG. 9, inductors 211, 213 are arranged in a transformer-like scheme 21.

Two power control circuits 203a, 203b are electrically connected to the third trans-conductance circuit (Gm3) 203. The third trans-conductance circuit (Gm3) 203 needs to be controlled by two power control circuits 203a, 203b because the third trans-conductance circuit (Gm3) 203 is electrically connected to both inductors 211, 213. Relatively, each of the first and the second trans-conductance circuits (Gm1 and Gm2) 201, 202 is electrically connected to only one of inductors 211, 213. Therefore, the power control circuits 201a and 202a are respectively electrically connected to the first and the second trans-conductance circuits (Gm1 and Gm2) 201, 202.

Figure 10:
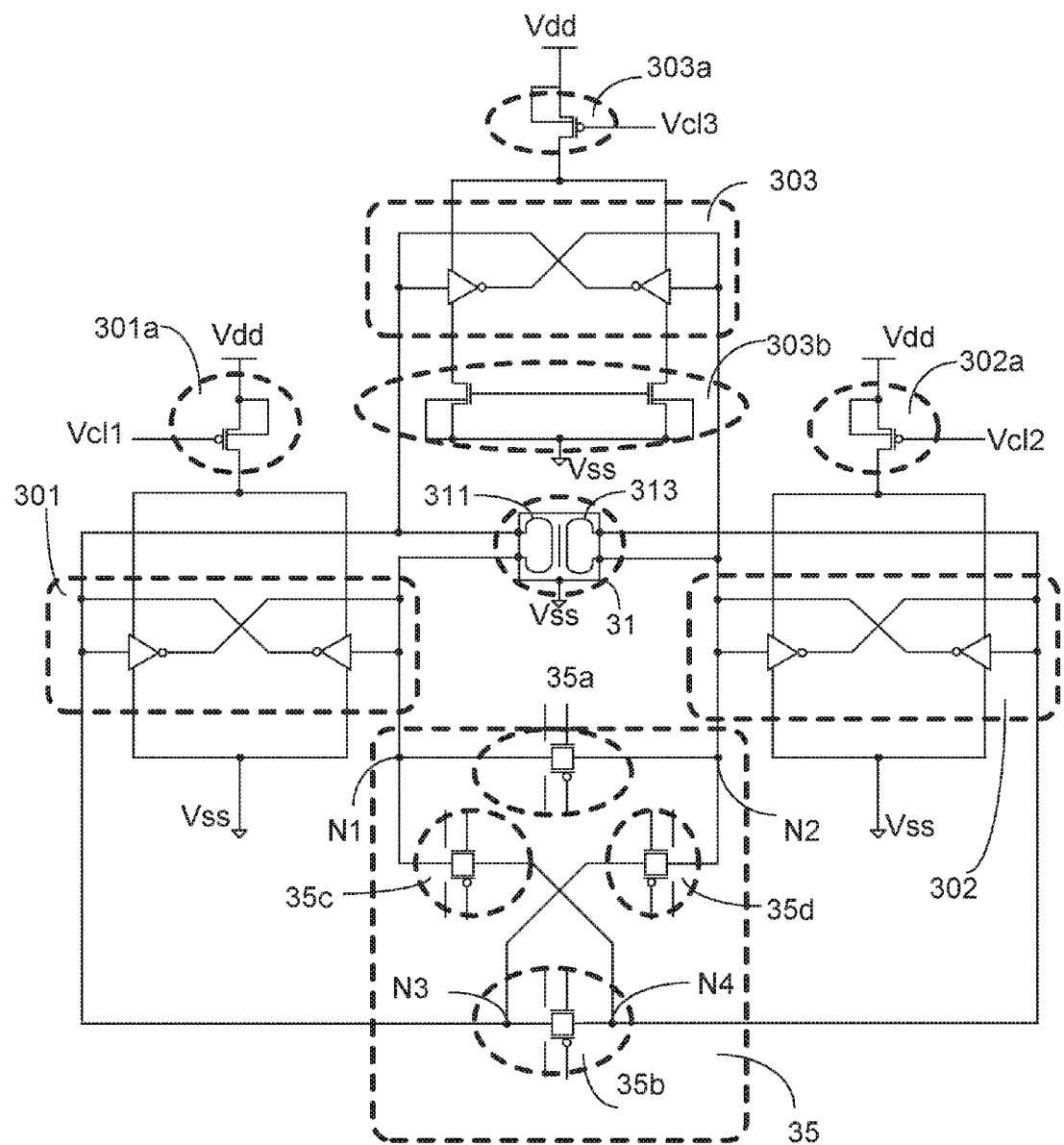
FIG. 10 is a schematic diagram illustrating implementation of the signal generator according to an embodiment of the present disclosure.

FIG. 10 is a schematic diagram illustrating implementation of the signal generator according to an embodiment of the present disclosure. In FIG. 10, transmission gates 601, 602, 603, 604 are used to implement switches S1, S2, S3 and S4. According to small-signal model of the transmission gate, the PMOS transistor and the NMOS transistor of the same transmission gate can be simultaneously conducted or disconnected. Each of the trans-conductance circuits (Gm1, Gm2, Gm3) 301, 302, 303 is assumed to include a pair of cross-coupled inverters. Layout shown in FIG. 10 is not drawn to scale and relative positions of the components are not precise. For example, the switching circuit 35 and the trans-conductance circuits (Gm1, Gm2, Gm3 and Gm4) are shown outside the transformer-like scheme 31 but should be within the transformer-like scheme 31.

In FIG. 10, the power control circuit 301a, 302a, 303a are assumed to be PMOS transistors whose sources are electrically connected to a supply voltage (Vdd). The power control circuit 303b can be a pair of NMOS transistors whose gate terminals are jointly connected, and whose sources are jointly electrically connected to a ground voltage (Vss). The gate terminal of the PMOS transistor in the power control circuit 301a is controlled by a first control signal (Vcl1). The first trans-conductance circuit (Gm1) 301 is disabled when the first control signal (Vcl1) is at high level; and the first trans-conductance circuit (Gm1) 301 is enabled when the first control signal (Vcl1) is at low level. Similarly, the gate terminal of the PMOS transistors in the power control circuits 302a, 303a are respectively controlled by a second control signal (Vcl2) and a third control signal (Vcl3).

Figure 11:
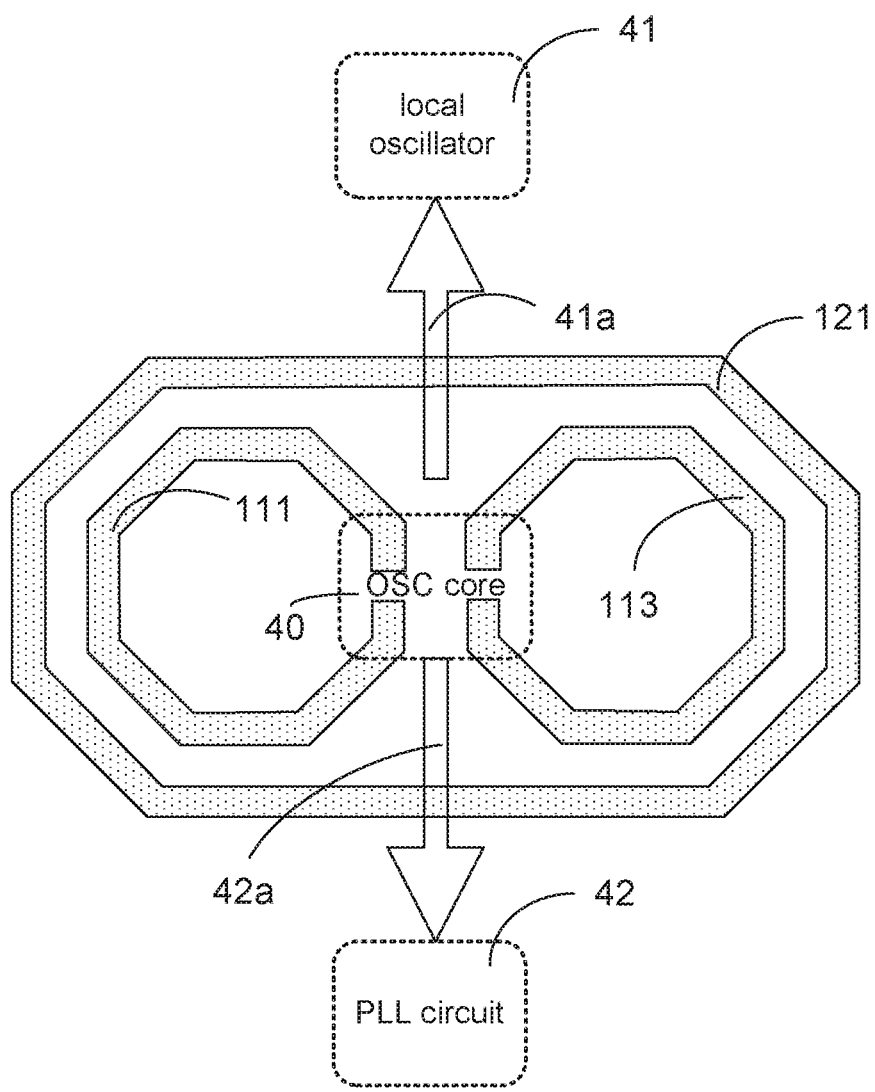
FIG. 11 is a schematic diagram illustration the layout between the inductors and an oscillation core.

FIG. 11 is a schematic diagram illustration the layout between the inductors and an oscillation core. The oscillation signal(s) being outputted by the oscillation core 40 can be generated at two terminals, one of the first terminal (N1) and the third terminal (N3), and one of the second terminal (N2) and the fourth terminal (N4). The oscillation core 40 needs to transmit the oscillation signal(s) to the local oscillator 41 through a local oscillation (hereinafter, LO) path 41a, and to the PLL circuit 42 through a feedback (hereinafter, FB) path 42a. The LO path 41a and the FB path 42a are highly likely being interfered by each other and are preferably separated. In FIG. 11, the local oscillator 41 and the PLL circuit 42 can simultaneously receive the oscillation signal(s) from the oscillation core 40. Therefore, the floorplan of the present disclosure can be suitable to avoid interferences. In practical application, the arrangement of connections to the LO path 41a and the FB path 42a can be interchanged.

In practical application, design and selection of the trans-conductance circuits are flexible. For example, depending on the requirement of the target communication system, it is possible to adopt only two or three trans-conductance circuits.

In a case that only the first and the second trans-conductance circuits (Gm1 and Gm2) are adopted in the signal generator, the signal generator may support the single loop mode, the parallel coupled mode, and the cross coupled mode. In a case that only the first and the third trans-conductance circuits (Gm1 and Gm3) are implemented in the signal generator, the signal generator may support the single loop mode and the cross coupled mode only. In a case that only the first, the second and the third trans-conductance circuits (Gm1, Gm2 and Gm3) are adopted in the signal generator, the signal generator may support the single loop mode, the parallel coupled mode, and the cross coupled mode. In conclusion, the signal generator can be easily applied to different communication standards based on scalable and reconfigurable configurations. The signal generator according to the present disclosure can achieve a wide tuning range, low power consumption, small circuit size, high quality, and small phase noise (PN) degradation. Besides, the cost and required chip area can be reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A signal generator, comprising:
    a resonator circuit, comprising:
        a first inductor having a first terminal and a second terminal;
        a second inductor having a third terminal and a fourth terminal; and
        a switching circuit, comprising a plurality of switches, wherein a configuration of the plurality of switches are adjustable and resonances generated between the first, the second, the third and the fourth terminals are changed accordingly;
    a first circuit, connected to the first terminal of the first inductor and the second terminal of the first inductor; and
    a second circuit connected to the first terminal of the first inductor and the fourth terminal of the second inductor, the second circuit comprising at least one transistor.

2. The signal generator according to claim 1, wherein the switching circuit comprises at least one of:
    a first switch, selectively electrically connected to the first and the third terminals;
    a second switch, selectively electrically connected to the second and the fourth terminals;
    a third switch, selectively electrically connected to the first and the fourth terminals; and
    a fourth switch, selectively electrically connected to the second and the third terminals.

3. The signal generator according to claim 2, wherein:
    when the switching circuit is in a first mode, all the first, the second, the third and the fourth switches are turned off;
    when the switching circuit is in a second mode, the first and the second switches are turned on, and the third and the fourth switches are turned off;
    when the switching circuit is in a third mode, the first and the second switches are turned off, and the third and the fourth switches are turned on; and
    when the switching circuit is in a fourth mode, the first and the second switches are turned off, one of the third and the fourth switches is turned on and the other of the third and the fourth switches is turned off.

4. The signal generator according to claim 3, wherein:
    the first circuit is enabled and the second circuit is disabled when the switching circuit is in the first mode, the second mode, or the third mode; and the first circuit is disabled and the second circuit is enabled when the switching circuit is in the fourth mode.

5. The signal generator according to claim 3, wherein:
    when the switching circuit is in the second mode, a direction of a first current flowing through the first inductor and a direction of a second current flowing through the second inductor are opposite;
    when the switching circuit is in the third mode, a direction of a third current flowing through the first inductor and a direction of a fourth current flowing through the second inductor are consistent; and
    when the switching circuit is in the fourth mode, a direction of a fifth current flowing through the first and the second inductors is in an 8-shape.

6. The signal generator according to claim 1, wherein the resonator circuit further comprises:
    a plurality of capacitors, wherein each of the plurality of capacitors is electrically connected to one of the first, the second, the third, and the fourth terminals, wherein at least one of the plurality of capacitors and at least one of the first and the second inductors jointly occur resonance when the first circuit or the second circuit is enabled.

7. The signal generator according to claim 6, wherein:
    a first capacitor among the plurality of capacitors is electrically connected to the first terminal;
    a second capacitor among the plurality of capacitors is electrically connected to the second terminal;
    a third capacitor among the plurality of capacitors is electrically connected to the third terminal; and
    a fourth capacitor among the plurality of capacitors is electrically connected to the fourth terminal.

8. The signal generator according to claim 1, further comprising:
    a third circuit connected to the third terminal of the second inductor and the fourth terminal of the second inductor.

9. The signal generator according to claim 8, wherein:
    when an interference source is relatively far from the first inductor and relatively close to the second inductor, the first circuit is enabled, and the third circuit is disabled; or
    when the interference source is relatively close to the first inductor and relatively far from the second inductor, the first circuit is disabled, and the third circuit is enabled.

10. The signal generator according to claim 1, further comprising:
    a fourth circuit connected to the second terminal of the first inductor and the third terminal of the second inductor.

11. The signal generator according to claim 1, wherein shape of the first inductor and the second inductor are symmetric, and the first and the second inductors are surrounded by a third inductor.

12. A resonator circuit, comprising:
    a first inductor, having a first terminal and a second terminal and electrically connected to a first circuit;
    a second inductor, having a third terminal and a fourth terminal, wherein one of the first and the second terminals and one of the third and the fourth terminals are electrically connected to a second circuit;
    a plurality of capacitors, each of the plurality of capacitors is electrically connected to a reference terminal and a single one of the first, the second, the third, and the fourth terminals; and a switching circuit, comprising a plurality of switches, wherein a configuration of the plurality of switches are adjustable and resonances generated between the first, the second, the third and the fourth terminals are changed accordingly.

13. The resonator circuit according to claim 12, wherein:
a first capacitor among the plurality of capacitors is electrically connected to the first terminal and the reference terminal; and
a second capacitor among the plurality of capacitors is electrically connected to the second terminal and the reference terminal.

14. The resonator circuit according to claim 12, wherein:
a third capacitor among the plurality of capacitors is electrically connected to the third terminal and the reference terminal; and
a fourth capacitor among the plurality of capacitors is electrically connected to the fourth terminal and the reference terminal.

15. The resonator circuit according to claim 12, wherein the switching circuit comprises:
a first switch, selectively electrically connected to the first and the third terminals;
a second switch, selectively electrically connected to the second and the fourth terminals;
a third switch, selectively electrically connected to the first and the fourth terminals; and
a fourth switch, selectively electrically connected to the second and the third terminals.

16. The resonator circuit according to claim 15, wherein:
when the switching circuit is in a first mode, all the first, the second, the third and the fourth switches are turned off;
when the switching circuit is in a second mode, the first and the second switches are turned on, and the third and the fourth switches are turned off;
when the switching circuit is in a third mode, the first and the second switches are turned off, and the third and the fourth switches are turned on; and
when the switching circuit is in a fourth mode, the first and the second switches are turned off, one of the third and the fourth switches is turned on and the other of the third and the fourth switches is turned off.

17. The resonator circuit according to claim 16, wherein:
the first circuit is enabled and the second circuit is disabled when the switching circuit is in the first mode, the second mode, or the third mode; and
the first circuit is disabled and the second circuit is enabled when the switching circuit is in the fourth mode.

18. The resonator circuit according to claim 12, wherein the other one of the first and the second terminals is electrically connected to a third circuit, and the other one of the third and the fourth terminals is electrically connected to the third circuit.

19. The resonator circuit according to claim 12, wherein shape of the first inductor and the second inductor are symmetric, and the first and the second inductors are surrounded by a third inductor.

* * * * *